United States Patent [19]

Sohlström

[11] Patent Number: 4,753,038
[45] Date of Patent: Jun. 28, 1988

[54] CLOSURE ASSEMBLY FOR PREVENTING TRANSMISSION OF INTERFERENCE FIELDS

[75] Inventor: Lasse Sohlström, Eura, Finland

[73] Assignee: Euroshield Oy, Finland

[21] Appl. No.: 933,623

[22] Filed: Nov. 21, 1986

[30] Foreign Application Priority Data

Nov. 21, 1985 [FI] Finland .................................. 854610

[51] Int. Cl.⁴ .............................................. E05D 15/10
[52] U.S. Cl. ......................................... 49/212; 49/221; 49/411
[58] Field of Search ................. 49/212, 209, 221, 404, 49/483, 425, 411; 174/35 GC, 35 MS

[56] References Cited

U.S. PATENT DOCUMENTS

| | | | |
|---|---|---|---|
| 914,411 | 3/1909 | Hill | 49/212 |
| 1,135,918 | 4/1915 | Peterson | 49/212 |
| 1,284,486 | 11/1918 | Stavnizky | 49/425 |
| 2,157,678 | 5/1939 | Schielke | 49/221 X |
| 2,893,071 | 7/1959 | Oden | 49/221 X |
| 3,009,984 | 11/1961 | Lindgren | 174/35 MS |
| 3,412,507 | 11/1968 | Sterner | 49/212 |
| 4,069,618 | 1/1978 | Geiss | 49/483 |
| 4,486,980 | 12/1984 | O'Bar | 49/411 X |
| 4,561,209 | 12/1985 | Sohlstrom | 49/483 |

Primary Examiner—Philip C. Kannan
Attorney, Agent, or Firm—Steinberg & Raskin

[57] ABSTRACT

A closure assembly for preventing transmission of interference fields, especially high-frequency magnetic fields. The assembly comprises a closure which is disposed to be movable with respect to a fixed structure, with the closure and/or the fixed structure being provided with elements for establishing contact and thereby preventing transmission of interference fields between the two. In accordance with the present invention, the closure is disposed to move substantially rectilinearly in a direction substantially perpendicular to a plane along a surface of the closure, and substantially rectilinearly in a direction substantially parallel to the plane of the closure.

21 Claims, 5 Drawing Sheets

CLOSURE ASSEMBLY FOR PREVENTING TRANSMISSION OF INTERFERENCE FIELDS

BACKGROUND OF THE INVENTION

The present invention is directed to an assembly having a door situated with respect to a fixed structure, for preventing transmission of interference fields, especially high frequency electromagnetic fields. The door is disposed to be displaceable by hinge means with respect to the fixed structure, while the door and/or the fixed structure is provided with means, i.e. members for establishing contact between the door and the fixed structure to prevent transmission of interference fields.

The goal of structures used in order to produce a space that is shielded against interference, may be to prevent external electromagnetic energy from penetrating into the shielded space, or to confine electromagnetic energy to the space defined by the structure by preventing leakage of the field into the ambient surroundings. Structures of this type are known in the prior art, and are commonly employed to shield sensitive equipment against electromagnetic radiation, and to enable measurements which are free of radio-frequency interference, to be carried out in industry, research, and, for instance, by hospitals applying data transfer and high frequency technology.

Depending upon the intended use of the shielded space, the part of the shielding presenting poorest attenuation is usually the point of contact between the openable door, window, hatch or equivalent, which is indispensable for access to the shielded space and the fixed structure. In order to avoid effects impairing the shielding properties of the door, the electric contact between the moving part of the door and the frame, and the reluctance path in the case of shielding against low-frequency magnetic fields, should be as continuous as possible and should be equivalent to the properties of the rest of the structure. It is possible to improve the attenuation characteristics of the joint between the door and frame, above all when high frequencies are concerned, with a labyrinth structure disposed at the point of contact. Knife-like contact tongues on the door are pressed inbetween contact springs provided in a channel encircling the aperture, with the purpose of ensuring contact.

However, limitations have been imposed on the performance achieved in practice with door designs of the prior art, due to the fact that the particular use of a multiple labyrinth structure has not been possible because of requisite close fits, and at the same time preservation of normal convenience in use of the door and the operating characteristics of a closure hinged in a normal manner. When an efficient and complex labyrinth structure is used, the contact tongues entering between the springs, due to the close fits, tend to damage the seal structure by bending under the effect of the turning motion of a normally turning door, with the seal springs thus being pushed out of alignment. Moreover, closing of such a closure requires a very high pressing force, e.g. 300 to 400 kp.

U.S. Pat. No. 4,561,209 discloses a closure structure for preventing transmission of interference fields, where the movement of the door involves a swinging motion about an axis defined by hinge means and a substantially rectilinear movement producing contact which prevents transmission of interference fields. It has however been found that, in the case of certain large door designs, such swinging motion about an axis is not the best conceivable solution to the problem. In such cases, the great weight of the door imposes tremendous requirements on the hinge means. Therefore, the high force and moments acting on the turning hinge arrangements of the heavy door structure, cause greater stress on the hinge arrangement than in the case with lighter door structures.

SUMMARY OF THE INVENTION

Accordingly, it is an object of the present invention to avoid the above-noted drawbacks associated with doors for electromagnetically-shielded spaces known in the prior art.

It is also an object of the present invention to provide a simple and inexpensive door system which is particularly well-suited for use in connection with heavy and wide door structures.

It is another object of the present invention to provide a door assembly exhibiting excellent performance regarding attenuation of interference fields, and, at the same time, being equivalent in convenience to the use and functioning of a normal door, to the greatest possible extent.

It is a further object of the present invention to provide an assembly having a door which can be rapidly and easily opened without any extra locking and pressing operations which impede the opening of such a door, e.g. in the case of emergencies.

It is still another object of the present invention to provide a simple door system having a door, which, when opened, exposes a good and smooth path directly into the electromagnetically-shielded space, without any need to provide various kind of ramp arrangements which would make the overall structure expensive and difficult to manage.

These and other objects are provided by the present invention which is directed to an assembly including a closure such as a door situated with respect to a fixed structure for preventing transmission of interference fields such as high-frequency electromagnetic fields between the closure and fixed structure. The closure is disposed to be movable with respect to the structure and at least one of the closure and the fixed structure is provided with means for establishing contact between the closure and structure for preventing transmission of interference fields between the two.

In particular, the closure assembly comprises a fixed structure defining an opening adapted to be closed by a closure, with a closure having a surface defining a plane being mounted to the fixed structure. Means for mounting the closure to the fixed structure are provided which include first hinge means provided on the fixed structure for moving the closure substantially rectilinearly and perpendicularly to the plane of the closure surface, and second hinge means for moving the closure substantially rectilinearly and parallel to the plane of the closure surface.

Thus, the above objects are attained by a closure or door assembly in accordance with the present invention having a door and a fixed structure for preventing transmission of interference fields, in particular high-frequency electromagnetic fields. In the door assembly, the door is disposed to move with the aid of first hinge means substantially rectilinearly in a direction which is substantially perpendicular (i.e. parallel to the normal against) the door plane i.e. the plane of a surface of the door, while the door is also disposed to move, with the aid of second hinge means, substantially rectilinearly in the direction of the door plane.

Although the invention herein is described with respect to a closure such as a door, it is understood within the context of the present invention that the same may be equally applied in connection with a closure such as a window or a hatch, and in other equivalent structures, all of which are intended to be included within the scope of the present invention as described further below.

BRIEF DESCRIPTION OF THE DRAWINGS

The present invention will now be described in greater detail with reference to the accompanying drawings in which FIG. 1 an axonometric perspective view of a door assembly according to the present invention, depicting a phase in which the door thereof is partially opened.

DESCRIPTION OF THE PREFERRED EMBODIMENTS

Figure 1:
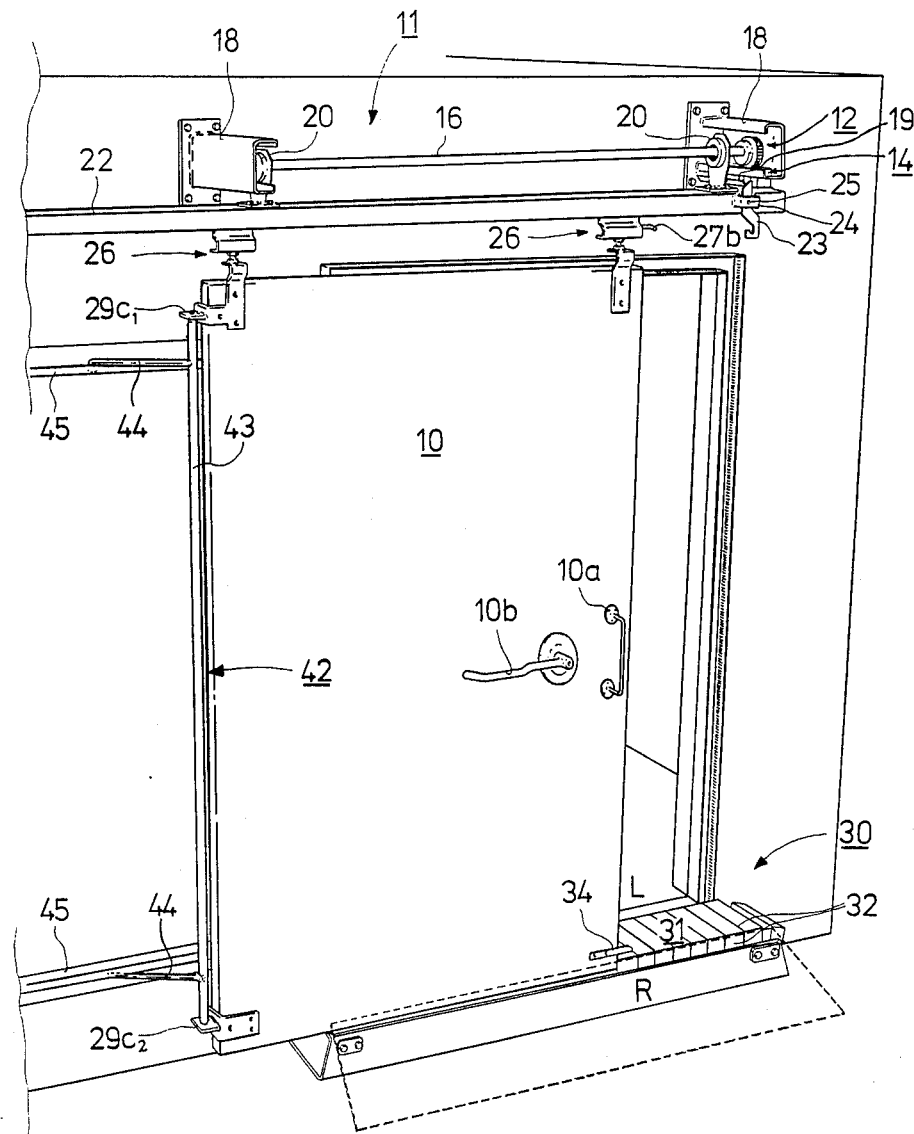

Referring to FIG. 1, a door of an assembly in accordance with the present invention has been generally indicated by reference numeral 10. As noted above, the definition of a closure such as a door 10 as used in the context of the present invention, may also mean a window or a hatch, or any other type of covering of an opening in a fixed structure. Accordingly, the terms "closure" and "door" as used herein, are not to be limited to a particular type of covering for an opening in a fixed structure.

The door 10 as illustrated herein, comprises a pull handle 10a and a locking handle 10b. The door 10 also comprises first hinge or suspension means 11, the hinge means 11 in turn comprising first 12 and second 14 coupling means which are coupled with one another so that the door 10 can be moved substantially rectilinearly in a direction which is substantially perpendicular (i.e. parallel to the normal of) the door plane, i.e. a plane along a surface of the door.

Figure 3:
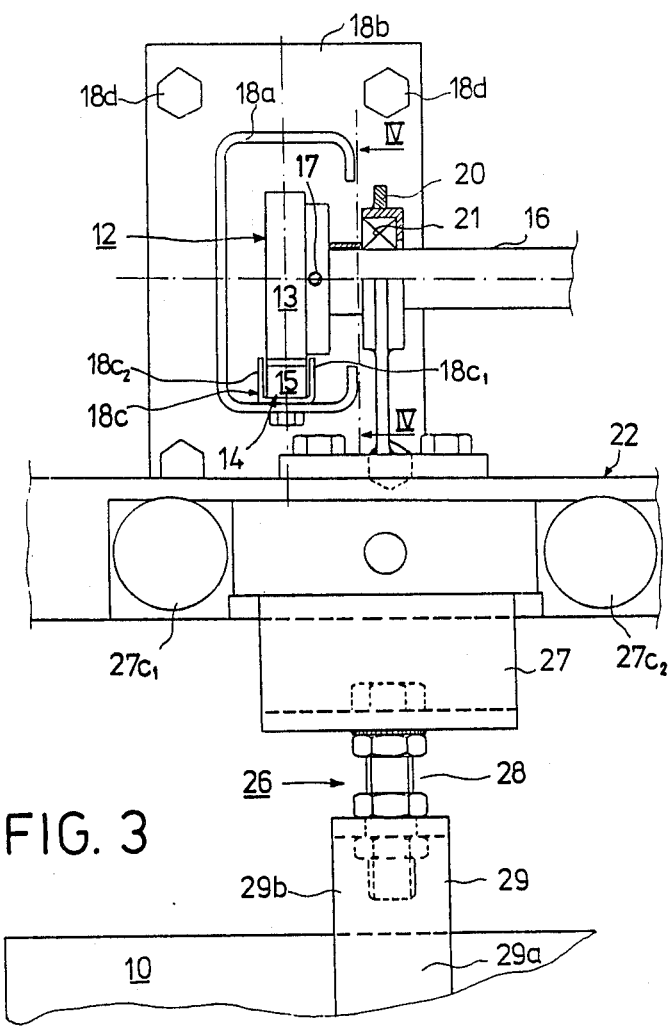
FIG. 3 is a detailed projection of first hinge means of a door structure in accordance with the present invention, as viewed from the front in FIG. 2, in the direction of arrow X.

In one embodiment of the present invention, the first coupling means 12 advantageously comprise a pinion 13, with the second coupling means 14 advantageously comprising a toothed rack 15. The pinion 13 is disposed to move with the teeth thereof along the toothed rack 15. In a preferred embodiment of the present invention, two pinions 13 are provided, and are joined together with a connecting rod 16. The pinions 13 are secured through a locking cam or cotter pin 17 or equivalent to the connecting rod 16 (FIG. 3). The toothed rack 15 is preferably disposed to be located in a beam 18. This beam 18 preferably has a C-section with one end open, so that the pinion 13 can move within the beam 18.

More particularly, the beam 18 comprises a cantilever portion 18a (the main body thereof), and a flange portion 18b welded or otherwise fixed onto the cantilever portion 18a, and through which the beam 18 can be further attached to fixed structures, e.g. to the wall structure. A detent member 19 has been additionally provided on the beam 18, however it is understood within the context of the present invention, that the detent member 19 may be equivalently situated in the vicinity of the beam 18, e.g. on the wall structure itself.

The rod-like member connecting the first coupling means 12, i.e. the pinions 13, advantageously a connecting rod 16 as noted above, is disposed to be rotatable and is carried by bearing lugs 20 and bearing means 21 as illustrated in FIG. 3, for instance slide or roller bearings. There are preferably two bearing lugs 20, which are disposed to be integral with a guide rod 22 or another elongated rod-like part. A bolt member 23 is rotatably provided on the guide rod 22, e.g. is disposed to be rotatable about a pivot pin 25. The pivot pin 25 is pivotally connected with fixing means 24 for the bolt member 23, and, advantageously, with the guide rod 22 too.

The door structure of the present invention further comprises second hinge means or suspension means 26, which have been functionally connected to the door 10. The suspension means 26 may advantageously comprise a suspension plate 27, adjusting means 28, and a fixing part or member 29 to the door 10 (FIG. 3). The adjusting means 28 itself may advantageously be screw means as illustrated. The adjusting means 28 enable the door 10 to be adjusted in the position of the height thereof, while the suspension plate 27 is disposed to move along the guide rod 22 as illustrated.

Figure 2:
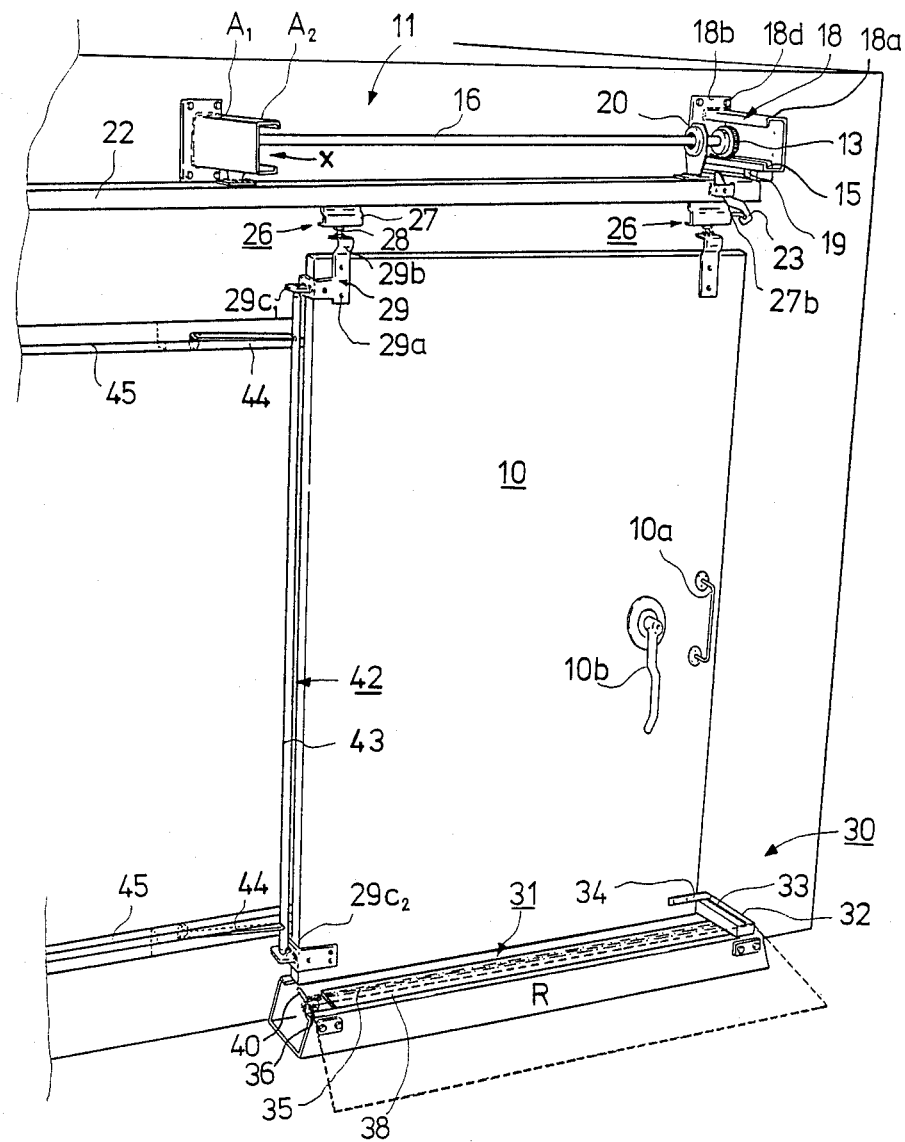
FIG. 2 is an axonometric perspective view similar to FIG. 1, with the door closed, and with a chain lamella structure cut open to illustrate the chain structure thereof.

The fixing part or member 29 of the suspension or second hinge means 26, attached to the door 10 as illustrated, preferably comprises a body portion 29a, a first lug portion or equivalent 29b, and a second lug portion 29c$_1$ (FIGS. 1 and 2). In the illustrated embodiment, there are preferably two suspension plates 27, one on either upper corner of the door 10 or closely adjacent thereto. The fixing part or member 29 is attached to the door 10 by screws or in another suitable manner. The second hinge or suspension means 26 preferably comprise rollers 27c$_1$, 27c$_2$ or equivalent, supported on the guide rod 22, and by which the door 10 is disposed to move along the guide rod 22 as illustrated in FIGS. 1 and 2.

A counterpart member 27b is disposed to cooperate with the suspension plate 27 of the suspension or second hinge means 26. More particularly, the counterpart member 27b is disposed to turn the bolt member 23 into a position such that, when the door 10 is in a position in which it covers the closure opening, the door 10 can be moved with the aid of the hinge means 11 into contact with the fixed structure of the closure assembly, preventing transmission of interference fields, with the first coupling means 12 of the first hinge means 11 being conveyed along the second coupling means 14 (i.e. the pinion 13 preferably runs along the teeth of the toothed rack 15.)

When the door 10 is not in a position in which it covers the door opening, then the bolt member 23 is in a position such that the door 10 cannot be moved together with its guide rod 22 in a direction substantially perpendicular to (i.e. normal against) the surface plane of the door 10 towards the position $A_1$. The counterpart member 27b, joined with the movement of the door 10, is disposed to open the bolt part or member 23 or equivalent, when the door 10 is ready to move in support of the suspension or second hinge means 26. In other words, the door 10 will only then move after the door 10 has first been moved, with the aid of the first hinge means 11, from position $A_1$ to position $A_2$.

Figure 4:
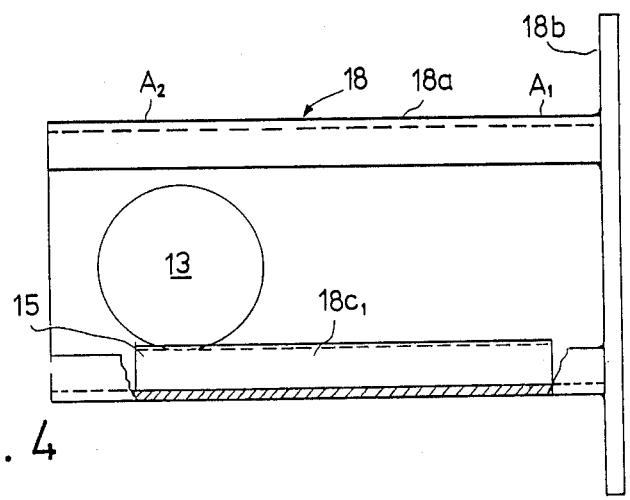
FIG. 4 is a side view along line IV-IV in FIG. 3.

The movement of the door 10 in the direction of its plane, supported by the second hinge or suspension means 26, is disposed to take place only in position $A_2$ (FIGS. 2 and 4). In this position $A_2$, the detent rod or member 19 on the beam 18, e.g. on the underside thereof, does not prevent the door 10 from moving in the direction of the plane thereof and supported by the second hinge or suspension means 26. In any other position, both in position $A_1$ and positions intermediate between $A_1$ and $A_2$, the detent rod or member 19 prevents the bolt member or part 23 from turning and, thereby, prevents the door 10 from moving in the direction of its surface plane, as supported by the second hinge or suspension means 26. However, when the door is in position $A_2$, then the bolt part 23 is free to turn, and is pulled by the counterpart member 27b, with the door 10 moving as supported by the second hinge or suspension means 26.

The door structure assembly according to the present invention preventing transmission of interference fields, additionally comprises means 30 for following along with the door 10, which preferably comprise a chain lamella assembly 31. More particularly, the chain lamella assembly 31 in accordance with the present invention, comprises a plurality of lamellae 32 (such as the appropriate disks or plates), which have been disposed to move into position in front of the threshold of the door opening, when the door 10 opens (FIG. 1).

More particularly, the lamellae 32 on top in the chain lamella assembly 31, are arranged to lie with top planes thereof flush with the floor L, so that as the door 10 opens, the lamellae 32 are disposed to lie with the top surface planes thereof flush with the top edge of an entrance ramp R and the fixed threshold parts of the closure structure and the floor L. The lamellae 32 are disposed to be pulled inbetween the top edge of the entrance ramp R and the floor structures and the level of the floor L. Therefore, separate arrangements are not needed for moving separate ramps into the interspace.

The door assembly of the present invention preventing transmission of interference fields, additionally comprises guide means 42. More particularly, the guide means 42 are disposed to support the door 10 by an edge thereof, and to guide the door 10 for moving the same in the direction of the plane of the door 10, and advantageously in the direction of the wall structure itself (i.e. in the direction substantially parallel to the plane of the door surface and in the direction substantially perpendicular to the plane of the door surface), when the door 10 is either being opened away from the door opening, or when the door 10 is being closed over the door opening respectively.

The guide means 42 preferably comprise a hinge axle 43 illustrated in FIG. 1, having a guide arm 44, preferably two guide arms 44. The guide arms 44 are disposed to be fixed to the hinge axle 43 at one end thereof, and have been arranged to move along guides 45 at the other end thereof, so that the guide arms 44, with the free end thereof, move along a substantially longitudinal, axial direction of the guide means, i.e. guides 45, and also turn in relation thereto. The door 10 has been disposed to turn about the hinge axle 43, in such a manner that pivoting of this turning motion is provided at lugs $29c_1$, $29c_2$, or equivalent.

A door assembly according to the present invention is illustrated in FIG. 2, in such a manner that the door 10 is in the closed position, and also, in this connection, in locked position. The locking handle 10b is pressed down. As illustrated in this figure, one lamella 32 has a lamella groove 33 which is a rectilinear groove running substantially parallel to a longitudinal axis of the lamella 32, substantially from end to end thereof as illustrated. A guide 34 is disposed to move in the lamella groove 33, this guide 34 preferably being a pin-like projection which is free at one end thereof, and attached at the other end thereof to the door 10, substantially at the lower edge thereof. The functional purpose of the lamella groove 33 and the guide 34 is to guide the door 10 by the lower edge thereof while the first coupling means 12, preferably the pinion 13, and the second coupling means 14, preferably the toothed rack 15, guide the upper edge of the door as the door moves from position $A_1$ to position $A_2$ or vice versa.

Figure 7:
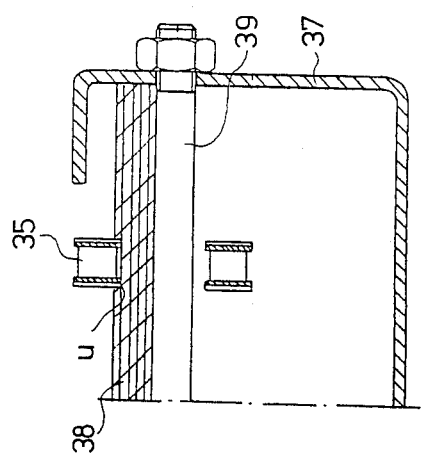
FIG. 7 is a view, partially in section, along line VII—VII of FIG. 5 illustrating the chain lamella structure.
Figure 6:
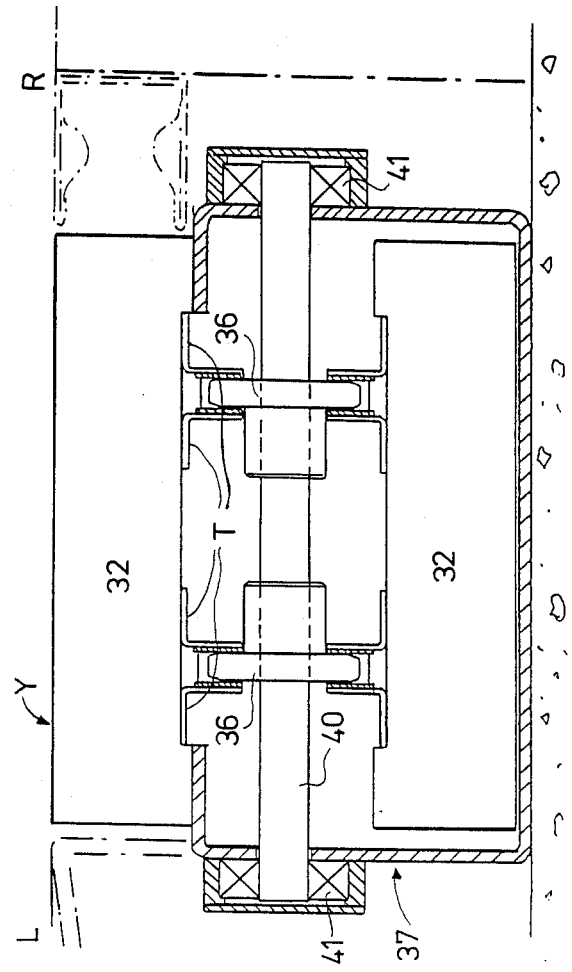
FIG. 6 is a sectional view along line VI—VI of FIG. 5, illustrating the chain lamella structure.

The chain lamella assembly 31 additionally comprises a chain 35 or equivalent, the chain 35 being disposed to move by support of wheels 36, which are preferably sprocket wheels. In a preferred embodiment of the present invention, there are two sprocket wheels 36 on each end of a frame beam 37 or equivalent, with there also being two chains 35 (FIG. 6). The chain 35 is disposed to move in a groove u in a supporting plate 38 (FIG. 7). The supporting plate 38 may be disposed to be movable in a lateral direction, whereby position of the chain 35 can be adjusted. Two supporting plate-carrying axles 39 are disposed to extend across the frame beam 37, and are preferably fitted onto the frame beam 37 with screw-and-nut attachments (FIG. 7).

The chain lamella assembly 31 additionally comprises a bearing shaft 40 for the sprocket wheel 36, preferably two such shafts 40 being provided with each bearing shaft 40 being disposed to rotate with the ends thereof carried by bearing means 41 in relation to the frame beam 37 (FIG. 6).

In FIG. 3, the first hinge means 11 of the present invention is illustrated in greater detail in elevation, and in partial section. The first coupling means 12 which preferably comprise the pinions 13, and the second coupling means 14 which preferably comprise the toothed racks 15 are more clearly illustrated in FIG. 3. The beam 18 may be formed of C-section steel, with the beam 18 comprising the cantilever portion 18a and a flange portion 18b on the end thereof as illustrated. The flange portion 18b is attached to the fixed structure, preferably with screws 18d. A fixing portion 18c for the toothed rack 15, having a substantially U-shaped cross section, is affixed on the bottom of the C-shaped section within the section profile in the central region of the base portion of the beam 18, as illustrated in FIG. 3. The fixing portion 18c is attached to the cantilever portion 18a with screw attachment 18d. A hole has been provided for the screw 18d in the cantilever portion 18a, this hole having a shape such that the position of the fixing portion 18c, and at the same time position of the toothed rack 15, can be changed in relation to the beam 18. Thus, the possibility of adjusting the toothed rack 15, is provided hereby.

The toothed rack 15 carries teeth on the upper surface thereof, fitted to mate with those of the pinion 13. Thus, the toothed rack 15 and the pinion 13 are cooperative. The pinion 13 is mounted with a cotter pin 17 or other equivalent securing means onto the connecting rod 16. The connecting rod 16 is disposed to be rotatable and is supported by bearing means 21, preferably roller or slide bearings, in the bearing lugs 20. Only one bearing lug 20 is illustrated in FIG. 3, and likewise, only one of two pinion/rack structures 13, 15 are illustrated in this figure. The bearing lug 20 is attached by screws or other equivalent means to the guide rod 22.

FIG. 4 is a view along line IV—IV of FIG. 3, with the first coupling means 12 and second coupling means 14 schematically illustrated in part, in this figure. The pinion 13 is disposed to move from position $A_2$ to the flange-side end $A_1$ of the flange 18b on the beam 18, along the toothed rack 15. This is promoted not only by the tooth contact between the pinion 13 and the toothed rack 15, but also by the height of the walls $18c_1$ and $18c_2$ of the fixing part 18c having the substantially U-shaped cross-section, which has been so selected that the walls $18c_1$ and $18c_2$ of the substantially U-shaped section prevent excessive movement of the pinion 13 in the lateral direction. When the pinion 13 is in position $A_1$, the door is ready to be closed by turning the locking handle 10b.

Figure 5:
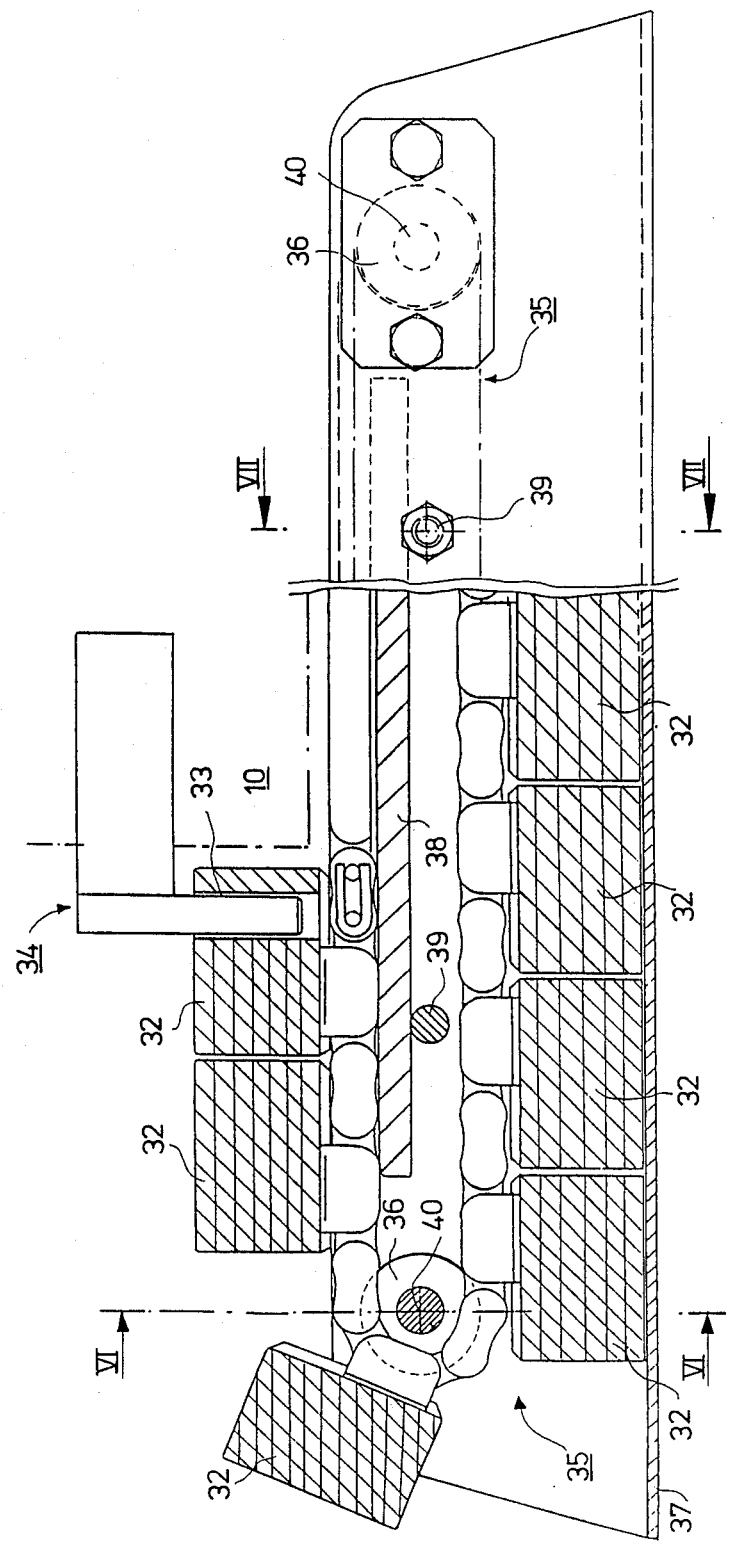
FIG. 5 is an elevational view, partially in cross-section, of the chain lamella structure of FIGS. 1 and 2.

The chain lamella assembly 31 is illustrated in greater detail in FIG. 5, and comprises a plurality of lamellae 32. The elongated lamella groove 33 is formed in one of the lamella 32 and runs longitudinally thereto, with the guide 34 fitted to move within this groove 33 enabling the lower edge of the door 10 to move towards the fixed structure forming part of the door assembly, for closing the door 10. The guide 34 also serves as means for moving the lamellae 32 and chains 35 when the door is being pulled in the direction substantially parallel to the plane of its surface, either into the closed or open position. The chains 35 are disposed to run upon the supporting plate 38, with the lamellae 32 being attached to the chains 35. The chain 35 is an endless chain arranged to run over at least two sprocket wheels 36. The chain 35 and sprocket wheels 36 have been arranged to be located within the frame beam 37 or equivalent supporting frame. The number of lamellae 32 has been chosen such that when the door 10 is in its fully open position, the lamellae cover a distance substantially equal to the entire door width.

In a preferred embodiment of the present invention, the supporting plate 38 is attached with respect to the frame beam 37, to be carried by the supporting axles 39 (FIG. 7). Two supporting axles 39 are preferably provided, and are disposed to be attachable to the frame beam 37 by screws or equivalent, as noted above.

FIG. 6 is a sectional view along line VI—VI of FIG. 5. There is a sprocket wheel-carrying shaft 40 situated on both longitudinal ends of the frame beam 37, on which two sprocket wheels 36 have been mounted, with a chain 35 being passed around each sprocket wheel 36 as illustrated. The bearing shafts 40 of the sprocket wheels 36 have been mounted within bearing means 41, to be rotatable. Each lamella 32 has been attached to the chains 35 with a fixing member T. It is seen in FIG. 6 that when the lamellae are on the upper run of the chain 35, then the top surfaces Y of the lamellae 32 are substantially level with the top surfaces of the floor L and the ramp R of the structures on either side thereof.

FIG. 7 is a sectional view along line VII—VII of FIG. 5, this section also being in partial projection. One of the two endless chains 35 is illustrated in FIG. 7, with the chain 35 being disposed to run in a groove u on the top face of the supporting plate 38, this groove u serving as a guiding groove for the chain 35. The supporting axle 39 for the supporting plate 38 is also seen in FIG. 7.

Figure 8:
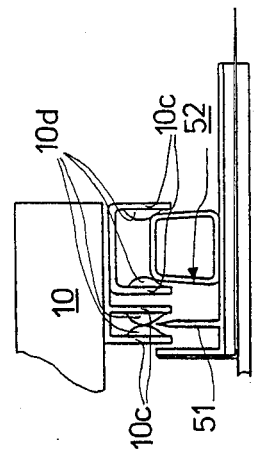
FIG. 8 is a horizontal sectional view of a labyrinth structure between the moving parts of a door and the fixed parts of the door structure in a door assembly according to the present invention.

FIG. 8, illustrates another detail of a door assembly in accordance with the present invention. As illustrated in this figure, the door 10 and/or the fixed structure is provided with means, i.e. members 10d, 10c, 50, 51 for establishing contact between the door 10 and the fixed structure to prevent propagation of interference fields.

The door 10 generally comprises a plurality of channels 10d which have been formed of sectional members of suitable, electrically conductive material. The side walls opposite the channels 10d have been fitted with springs 10c, made, e.g., of beryllium bronze, serving as seals. When the door is closed, the springs 10c receive therebetween members associated with the fixed structure, namely a tongue-like contact knife 51 generally situated closest to the edge of the door 10, and a guide 52 having a wedge-shaped cross-section (FIG. 8). The object of the springs 10c is to establish the best possible electrical contact between the contact knife 51 or the guide 52, and the walls of the channel 10d, and also to direct the guide 52 with the wedge-shaped cross-section precisely into proper position when the door 10 is being closed.

Due to the close fits required for reliable contact and guiding, pressing of the contact knife 51 and the guide 52 between the contact springs 10c, for closing the door 10 and forwardly from the position illustrated in FIG. 8, is accomplished not only with the aid of rectiliner movement of the door 10. Rather, when the door 10 is being closed, the last part of the movement, about 2 cm., takes place as in U.S. Pat. No. 4,561,209, namely in a direction at right angles against the surface of the door 10, by turning the locking handle 10b, whereby linkage mechanisms (not-illustrated) move with the ends thereof, as in U.S. Pat. No. 4,561,209, into the ends of bevelled guide grooves, so that the closure 10 will be pulled tightly with great force into its closed position.

The preceding description of the present invention is merely exemplary, and is not intended to limit the scope thereof in any way.

What is claimed is:

1. An assembly including a closure situated with respect to a fixed structure for preventing transmission of interference fields such as high frequency electromagnetic fields between said closure and fixed structure, said closure disposed to be movable with respect to said structure and at least one of said closure and fixed structure being provided with means for establishing contact between said closure and structure and preventing transmission of interference fields between the two, comprising:

a fixed structure defining an opening adapted to be closed by a closure;

a closure having a surface defining a plane, said closure being mounted to said fixed structure;

means for mounting said closure to said fixed structure, including first suspension means provided on said fixed structure for moving said closure substantially rectilinearly and perpendicularly to said plane of said closure surface; and second suspension means for moving said closure substantially rectilinearly and parallel to the plane of said closure surface;
wherein said second suspension means comprise a guide track mounted upon said first suspension means for movement in said substantially perpendicular direction, with said closure mounted upon said guide track for movement in said substantially parallel direction.

2. The assembly of claim 1, wherein said first suspension means comprise:
first coupling means connected with one of said closure and structure, and
second coupling means connected with the other of said closure and structure,
said first and second coupling means engaged with one another to change respective position when said closure is moved substantially perpendicularly to the plane of said surface thereof.

3. The assembly of claim 2, wherein said first coupling means comprise a pinion, and
said second coupling means comprise a toothed rack, said pinion disposed to move along said toothed rack.

4. The assembly of claim 1, wherein said second suspension means comprise
a guide track mounted upon one of said closure and said first suspension means, and
means situated on the other of said closure and said first suspension means for guiding movement of said closure as said closure moves substantially parallel to the plane of the surface thereof.

5. The assembly of claim 4, wherein said guide track is a rod affixed to said first suspension means, and
said guide means comprise rollers situated on said closure and contacting said guide rod.

6. The assembly of claim 4, wherein said guide means comprise
a suspension plate mounted on said guide track for movement therealong,
a lug affixed to said closure, and
means interconnecting said plate and said lug, for adjusting distance between the two, such that height of said closure can be adjusted.

7. An assembly including a closure situated with respect to a fixed structure for preventing transmission of interference fields such as high frequency electromagnetic fields between said closure and fixed structure, said closure disposed to be movable with respect to said structure and at least one of said closure and fixed structure being provided with means for establishing contact between said closure and structure and preventing transmission of interference fields between the two, comprising:
a fixed structure defining an opening adapted to be closed by a closure; a closure having a surface defining a plane, said closure being mounted to said fixed structure;
means for mounting said closure to said fixed structure, including
first suspension means provided on said fixed structure for moving said closure substantially rectilinearly and perpendicularly to said plane of said closure surface; and
second suspension means for moving said closure substantially rectilinearly and parallel to the plane of said surface,
wherein said first suspension means comprise:
first coupling means connected with one of said closure and structure, and
second coupling means connected with the other of said closure and structure,
said first and second coupling means engaged with one another to change respective position when said closure is moved substantially perpendicularly to the plane of said surface thereof;
wherein said second coupling means additionally comprise a pair of toothed racks, and
said first coupling means additionally comprise a pair of pinions, each movably engaged with a respective toothed rack, and
a connecting rod interconnecting said two pinions.

8. The assembly of claim 7, wherein said second suspension means additionally comprise
a guide rod, said closure being mounted upon said guide rod for sliding therealong in a direction substantially parallel to a longitudinal axis of said guide rod,
said first coupling means additionally comprise bearing means in which said connecting rod is rotatably journalled and comprising at least one bearing lug connected to said guide rod of said second suspension means, and
said second coupling means additionally comprise at least one beam mounted upon said fixed structure, with said toothed racks mounted upon said at least one beam.

9. The assembly of claim 8, wherein said bearing means additionally comprise a pair of bearing lugs connected to said guide rod, and a pair of roller bearings, each roller bearing mounted in a respective lug.

10. The assembly of claim 8, wherein said second coupling means additionally comprise
a pair of beams, each toothed rack being mounted upon a respective beam, each beam comprising a flange portion mounted upon said fixed structure and a cantilever portion supporting said respective toothed rack, said cantilever portion substantially in the shape of a C, and
said cantilever portion additionally comprising a pair of walls for snugly seating said toothed rack to prevent excessive lateral movement thereof.

11. An assembly including a closure situated with respect to a fixed structure for preventing transmission of interference fields such as high frequency electromagnetic fields between said closure and fixed structure, said closure disposed to be movable with respect to said structure and at least one of said closure and fixed structure being provided with means for establishing contact between said closure and structure and preventing transmission of interference fields between the two, comprising:
a fixed structure defining an opening adapted to be closed by a closure;
a closure having a surface defining a plane, said closure being mounted to said fixed structure;
means for mounting said closure to said fixed structure, including
first suspension means provided on said fixed structure for moving said closure substantially rectilinearly and perpendicularly to said plane of said closure surface; and
second suspension means for moving said closure substantially rectilinearly and parallel to the plane of said closure surface;
additionally comprising means for following along with movement of said closure,
said following means comprising at least one chain and a plurality of lamellae attached to said chain and disposed to engage said closure as the same is moved substantially perpendicularly to said plane of the surface thereof and away from said fixed structure.

12. The assembly of claim 11, wherein
said closure comprises a guide mounted on a lower edge thereof and one of said lamellae having a corresponding substantially longitudinal groove for receiving said guide as said closure is moved outwardly from said fixed structure.

13. The assembly of claim 12, wherein said following means comprise at least one sprocket wheel over which said chain is disposed to run,
a bearing shaft upon which said at least one sprocket wheel is mounted, and
bearing means in which said bearing shaft is rotatably mounted.

14. The assembly of claim 13, wherein said following means additionally comprise
a supporting beam, with said bearing means mounted on the same, said supporting beam comprising a supporting plate having a groove in which said chain runs.

15. An assembly including a closure situated with respect to a fixed structure for preventing transmission of interference fields such as high frequency electromagnetic fields between said closure and fixed structure, said closure disposed to be movable with respect to said structure and at least one of said closure and fixed structure being provided with means for establishing contact between said closure and structure and preventing transmission of interference fields between the two, comprising:
a fixed structure defining an opening adapted to be closed by a closure;
a closure having a surface defining a plane, said closure being mounted to said fixed structure;
means for mounting said closure to said fixed structure, including
first suspension means provided on said fixed structure for moving said closure substantially rectilinearly and perpendicularly to said plane of said closure surface; and
second suspension means for moving said closure substantially rectilinearly and parallel to the plane of said closure surface;
wherein said second suspension means comprise
a guide track mounted upon one of said closure and said first suspension means, and
means situated on the other of said closure and said first suspension means for guiding movement of said closure as said closure moves substantially parallel to the plane of the surface thereof;
wherein said second suspension means additionally comprise
a bolt member pivotally mounted upon said guide track and, when in normal position, blocking movement of said closure in said substantially perpendicular direction to said plane of said surface thereof; and
a counterpart member fixedly connected to said closure and disposed to pivot said bolt member such that said closure may move in said substantially perpendicular direction to said plane.

16. The assembly of claim 15, additionally comprising a detent member fixedly mounted upon said fixed structure for urging said bolt member into the normal position thereof.

17. An assembly including a closure situated with respect to a fixed structure for preventing transmission of interference fields such as high frequency electromagnetic fields between said closure and fixed structure, said closure disposed to be movable with respect to said structure and at least one of said closure and fixed structure being provided with means for establishing contact between said closure and structure and preventing transmission of interference fields between the two, comprising:
a fixed structure defining an opening adapted to be closed by a closure;
a closure having a surface defining a plane, said closure being mounted to said fixed structure;
means for mounting said closure to said fixed structure, including
first suspension means provided on said fixed structure for moving said closure substantially rectilinearly and perpendicularly to said plane of said closure surface; and
second suspension means for moving said closure substantially rectilinearly and parallel to the plane of said closure surface;
additionally comprising
means for guiding an edge of said closure in said substantially parallel direction to the plane of the surface thereof, said guide means being coupled to said edge of said closure.

18. The assembly of claim 17, wherein said guide means comprise a hinge axle turnably mounted on said closure edge, and
fixing means for turnably mounting said hinge axle upon said closure edge.

19. The assembly of claim 18, wherein said fixing means comprise a pair of lugs mounted upon said closure edge.

20. The assembly of claim 19, wherein said guide means additionally comprise
at least two guide arms connected to said hinge axle, and
at least two substantially longitudinal guides mounted upon said fixed structure, with each guide arm being both pivotally and movably mounted in a respective guide.

21. An assembly including a closure situated with respect to a fixed structure for preventing transmission of interference fields such as high frequency electromagnetic fields between said closure and fixed structure, said closure disposed to be movable with respect to said structure and at least one of said closure and fixed structure being provided with means for establishing contact between said closure and structure and preventing transmission of interference fields between the two, comprising:
a fixed structure defining an opening adapted to be closed by a closure;
a closure having a surface defining a plane, said closure being mounted to said fixed structure;
means for mounting said closure to said fixed structure, including
first suspension means provided on said fixed structure for moving said closure substantially rectilinearly and perpendicularly to said plane of said closure surface; and second suspension means for moving said closure substantially rectilinearly and parallel to the plane of said closure surface;

and additionally comprising means for preventing said closure from moving in said substantially perpendicular direction towards said fixed structure, when said closure is not in a position to cover the opening defined by said fixed structure.

* * * * *